(12) United States Patent
Chen et al.

(10) Patent No.: US 12,488,717 B2
(45) Date of Patent: Dec. 2, 2025

(54) MENDING METHOD FOR DISPLAY

(71) Applicant: CONTREL TECHNOLOGY CO., LTD., Tainan (TW)

(72) Inventors: Tsan-Jen Chen, Tainan (TW); Chih-Hao Tsai, Tainan (TW); Yu-Cheng Yang, Tainan (TW); Jen-Hung Lo, Tainan (TW); Yan-Ru Tsai, Tainan (TW)

(73) Assignee: CONTREL TECHNOLOGY CO., LTD., Tainan (TW)

( * ) Notice: Subject to any disclaimer, the term of this patent is extended or adjusted under 35 U.S.C. 154(b) by 160 days.

(21) Appl. No.: 18/481,409

(22) Filed: Oct. 5, 2023

(65) Prior Publication Data

US 2024/0119875 A1 Apr. 11, 2024

(30) Foreign Application Priority Data

Oct. 7, 2022 (TW) .................................. 111138248

(51) Int. Cl.
  *G09G 3/00* (2006.01)
  *H01L 25/075* (2006.01)
  *H10H 29/14* (2025.01)

(52) U.S. Cl.
  CPC ......... *G09G 3/006* (2013.01); *H01L 25/0753* (2013.01); *H10H 29/142* (2025.01); *G09G 2300/026* (2013.01); *G09G 2330/12* (2013.01)

(58) Field of Classification Search
  None
  See application file for complete search history.

(56) References Cited

U.S. PATENT DOCUMENTS

| | | | | |
|---|---|---|---|---|
| 2017/0346011 | A1* | 11/2017 | Danesh | G09G 3/3426 |
| 2019/0237154 | A1* | 8/2019 | Choi | G11C 29/44 |
| 2020/0152827 | A1* | 5/2020 | Chen | H10H 20/857 |
| 2021/0265522 | A1* | 8/2021 | Ahn | H01L 21/67 |

FOREIGN PATENT DOCUMENTS

KR 102329818 * 11/2021 ............. H01L 21/50

OTHER PUBLICATIONS

Partial translation (Year: 2021).*

* cited by examiner

*Primary Examiner* — Richard Isla
(74) *Attorney, Agent, or Firm* — Muncy, Geissler, Olds & Lowe, P.C.

(57) ABSTRACT

A mending method for a display includes the steps of making a display device light to make a plurality of light emitting positions thereof shine, searching out a plurality of defect positions among the light emitting positions, providing a transferring device having a transferring surface with a plurality of miniature light emitting elements positioned correspondingly to the light emitting positions, planning a mending procedure which includes in the area the transferring surface corresponds to, choosing in chief the largest number of defect positions able to be mended at a single time according to the positions of the miniature light emitting elements and then in the area the transferring surface corresponds to, planning the rest of the defect positions according to the rest of the miniature light emitting elements, and according to the mending procedure, moving the transferring device to weld the miniature light emitting elements at the defect positions.

7 Claims, 6 Drawing Sheets

MENDING METHOD FOR DISPLAY

BACKGROUND OF THE INVENTION

1. Field of the Invention

The present invention relates generally to mending methods for electronic devices and more particularly, to a mending method for a display.

2. Description of the Related Art

With the development of display technology, the display technology gradually tends to form pixels by light emitting diodes. In the technology, a huge number of light emitting diode elements should be transferred onto the circuit substrate of the display. In the process of transferring the huge number of elements, many problems may make a part of the light emitting diodes not welded on the circuit substrate positively, thereby affecting the yield rate of the display. The aforementioned problems include insufficient light emitting diodes, broken light emitting diodes, bad attaching or bad welding in the transferring process, and so on.

The current improvement for these problems is using a mending technology to reweld good light emitting diode elements at the corresponding positions one by one. However, only one defect is mended at every time, so the mending apparatus has to execute the material taking, attaching and welding steps for many times back and forth, that will increase the mending time, thereby unfavorable for the production of the display products.

SUMMARY OF THE INVENTION

The present invention has been accomplished in view of the above-noted circumstances. It is an objective of the present invention to provide a mending method for a display, which can plan and execute a mending process efficiently.

The present invention provides a mending method for a display, which includes the following steps. At first, make a display device light. The display device includes a plurality of light emitting surfaces arranged adjacent to each other. Every light emitting surface includes a plurality of light emitting positions. Then, search out a plurality of defect positions. The plurality of defect positions represent those not emitting light among the plurality of light emitting positions of the plurality of light emitting surfaces. Then, provide a transferring device including a transferring surface and a plurality of miniature light emitting elements attached to the transferring surface. The positions of the plurality of miniature light emitting elements correspond to the plurality of light emitting positions. Then, plan a mending procedure. The mending procedure includes in the area the transferring surface corresponds to, choosing in chief the largest number of defect positions able to be mended at a single time according to the positions of the plurality of miniature light emitting elements, and then in the area the transferring surface corresponds to, planning the rest of the plurality of defect positions according to the rest of the plurality of miniature light emitting elements. At last, according to the mending procedure, move the transferring device to make the plurality of miniature light emitting elements welded at the plurality of defect positions.

In the present invention, the mending method for the display can search out at least one corresponding defect position in a specific area in sequence according to the arranged positions of the attached miniature light emitting elements, so as to plan the mending manner better than that mentioned in the description of the related art, thereby effectively reducing the period of time for mending and the number of mending times to raise the production effect.

BRIEF DESCRIPTION OF THE DRAWINGS

The steps, structure, features, and operation of the mending method for the display will be described in the following embodiments. However, it should be understood that the following embodiments and the figures are given by way of illustration only, not intended to limit the scope of the claims of the present invention, and wherein:

DETAILED DESCRIPTION OF THE INVENTION

The technical content and features of the present invention will be described in detail by the following instanced embodiments and the accompanying figures. For the detailed description of the technical features of the present invention, the following embodiment are instanced and illustrated in coordination with the figures.

Figure 1:
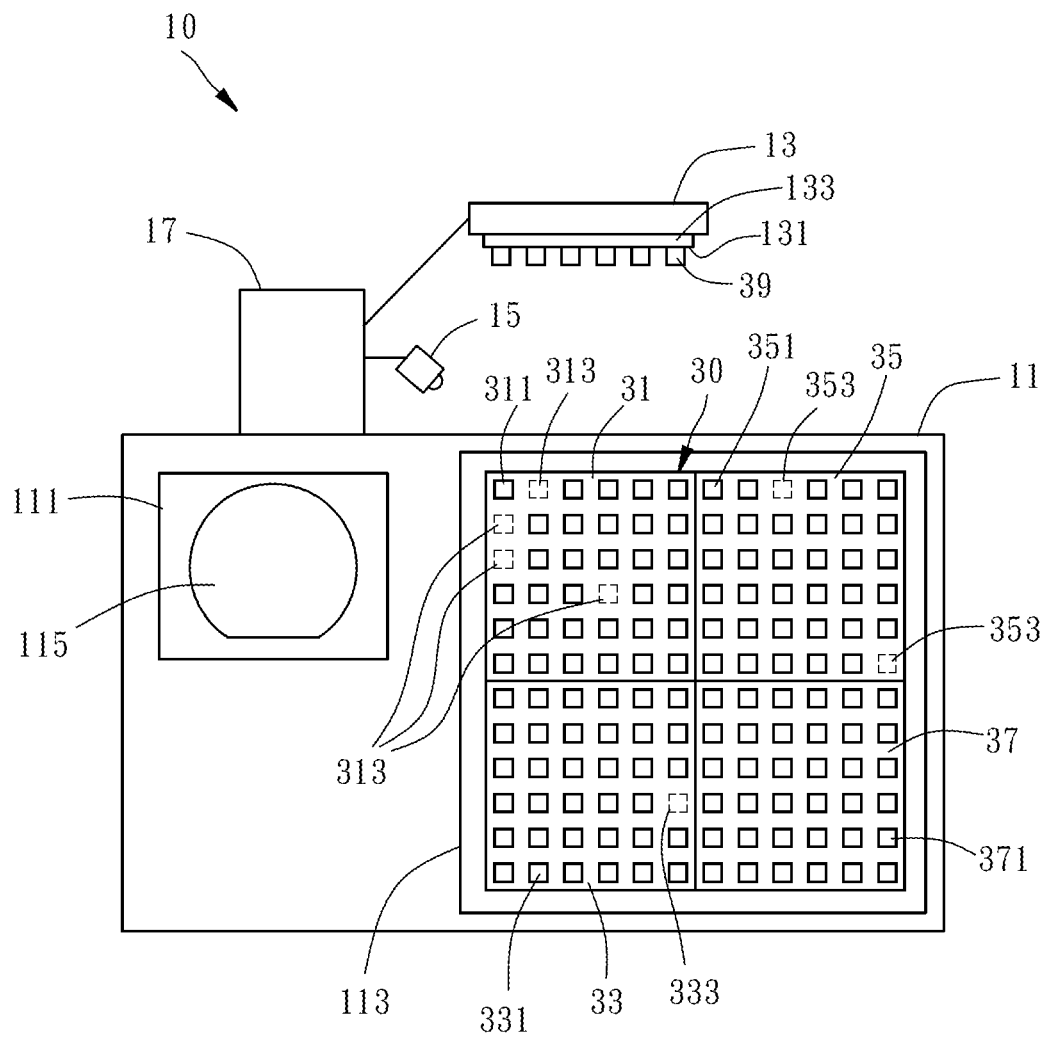
FIG. 1 is a schematic view of a mending apparatus for a display of the present invention.

As shown in FIG. 1, a mending apparatus 10 for a display of the present invention includes a carrying device 11, a transferring device 13, a visual device 15, and a work device 17.

The carrying device 11 includes a material carrier 111 and a test platform 113. The material carrier 111 is adapted to carry a wafer 115 or material tray. The wafer 115 or material tray includes a plurality of miniature light emitting elements. In other embodiments, the material carrier 111 may carry more wafers 115 or material trays.

The test platform 113 is adapted to dispose a display device 30. The display device is a seamless tiled display. The display device 30 includes four light emitting surfaces 31, 33, 35 and 37 which are equal in area and arranged adjacent to each other in a matrix manner. Every light emitting surface 31, 33, 35 or 37 includes a plurality of light emitting positions 311, 331, 351 or 371 arranged adjacent to each other. The light emitting positions 311, 331, 351 or 371 are arranged as a 6×6 matrix. At least one miniature light emitting element is disposed at every light emitting position 311, 331, 351 or 371, and electrically connected with the circuit of the display device 30. The intervals between the adjacent light emitting positions are equal. In other embodiments, the display device 30 may be not the seamless tiled display, because displays of other sizes can be still divided into appropriate light emitting surfaces or regions by the image processing technology. The light emitting surface of the display device 30 may be larger or smaller in area. The light emitting positions may be more or less in amount.

The transferring device 13 is disposed at the position opposite to the carrying device 11, and movable relative to the carrying device 11. The transferring device 13 includes a transferring surface 131, a compressible layer 133, and a plurality of miniature light emitting elements 39 attached to the transferring surface 131. The transferring surface 131 is formed on the compressible layer 133. In this embodiment, the compressible layer 133 will be deformed when being applied with pressure, and restore to the original shape when the pressure is removed. The quantity of the deformation is approximately the height of a miniature light emitting element 39. The quantity of the deformation allows the height difference of the display device 30, enabling the miniature light emitting element 39 to be installed at the light emitting position positively. The miniature light emitting elements 39 can be attached to the transferring device 13 from the wafer 115, which may be attached by glue, static electricity, Van der Waals force, vacuum or others. The transferring surface 131 and the light emitting surface 31, 33, 35 or 37 are equal in area. The positions of the miniature light emitting elements 39 correspond to the light emitting positions 311, 331, 351 or 371 of the light emitting surface 31, 33, 35 or 37.

The visual device 15 is disposed at the position opposite to the carrying device 11 for shooting the four light emitting surfaces 31, 33, 35 and 37 of the display device 30. In other embodiments, the visual scope of the visual device 15 may be larger than the area of four light emitting surfaces or smaller than the area of four light emitting surfaces.

The work device 17 is connected with the carrying device 11, the transferring device 13 and the visual device 15, and adapted to execute a mending method 50. For example, the work device 17 is a computer.

Figure 2:
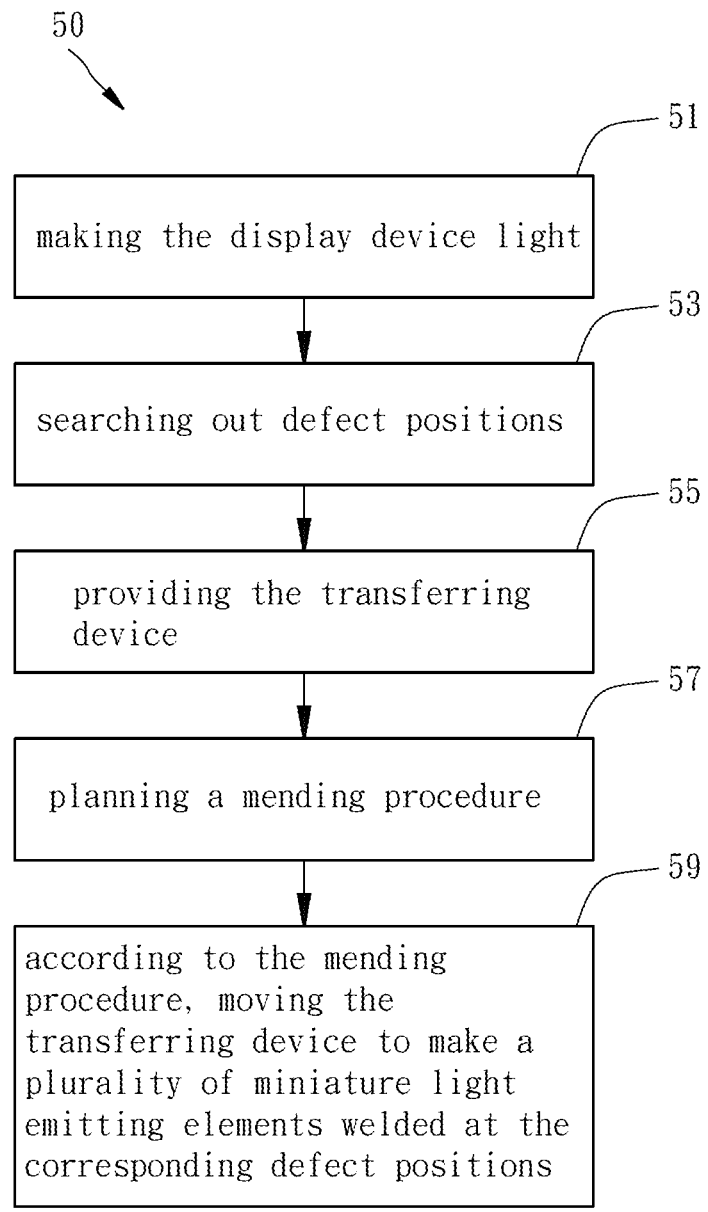
FIG. 2 is a flow chart of a mending method executed by the mending apparatus in FIG. 1.

As shown in FIG. 2, the mending method 50 includes five steps. The step 51 is making the display device light. The step 53 is searching out defect positions. The step 55 is providing the transferring device. The step 57 is planning a mending procedure. The step 59 is according to the mending procedure, moving the transferring device to make the plurality of miniature light emitting elements welded at the corresponding plurality of defect positions.

In the step 51, electricity is supplied to the display device 30 through a lighting unit of the test platform 113, making each of the light emitting positions 311, 331, 351 and 371 of the light emitting surfaces 31, 33, 35 and 37 light. If the light emitting position 311, 331, 351 or 371 lights, it means the miniature light emitting element located at the light emitting position 311, 331, 351 or 371 functions normally to emit light. In FIG. 1, the normal light emitting function is represented by solid rectangular boxes.

In the step 53, the defect positions 313, 333, 353 and 373 of the light emitting surfaces 31, 33, 35 and 37 are searched out through the shooting by the visual device 15. The defect positions 313, 333, 353 and 373 represent the dark light emitting positions 311, 331, 351 and 371, which means they should emit light but not emit light normally. In FIG. 1, dashed rectangular boxes represent the defect positions, at which there is no miniature light emitting element or the miniature light emitting element is broken.

Figure 3:
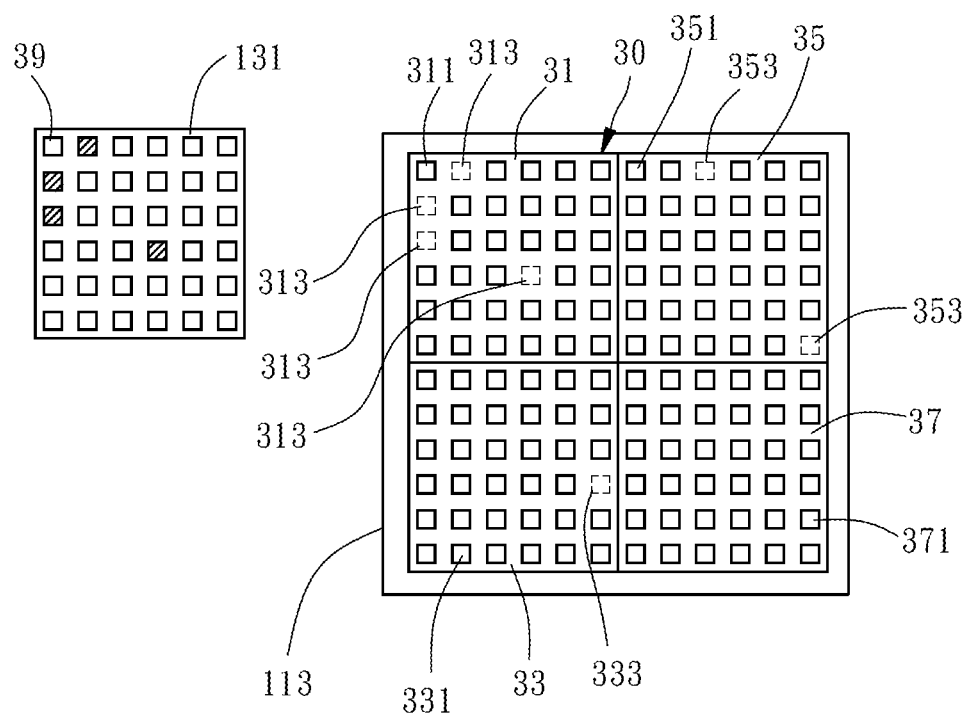
FIG. 3 to FIG. 6 are sequential schematic views of an embodiment of a mending procedure in FIG. 2.

The transferring device in the step 55 is as shown in FIG. 1. As shown in FIG. 3, 6×6 miniature light emitting elements 39 are attached to the transferring surface 131 of the transferring device in FIG. 3. The positions of the miniature light emitting elements 39 totally correspond to the light emitting positions 311, 331, 351 or 371. For the plurality of miniature light emitting elements 39 attached to the transferring surface 131, the actual position or coordinate of each miniature light emitting element 39 can be obtained by the image processing technology. In the image processing technology, for example, the transferring surface 131 is shot by the visual device 15 or other shooting devices, and every position or coordinate is determined whether there is a miniature light emitting element 39 or not by image processing. In other embodiments, the positions of the miniature light emitting elements 39 may not totally correspond to the light emitting positions 311, 331, 351 or 371, that will be specified hereinafter.

In the step 57, the mending procedure, or called mending sequence, is planned. As shown in FIG. 1, the light emitting surfaces 31, 33, 35 and 37 have different defect positions 313, 333, 353 and 373. In the light emitting surface 31, four defect positions 313 are searched out. In the light emitting surface 33, one defect position 333 is searched out. In the light emitting surface 35, two defect positions 353 are searched out. In the light emitting surface 37, no defect position is searched out. Therefore, for achieving better mending efficiency, in the mending procedure in this embodiment, comparing and matching are performed to the display 30 according to the area the transferring surface 131 corresponds to, and according to the arranged positions of the miniature light emitting elements 39, the region with the largest number of defect positions 313 able to be mended at a single time is chosen in chief. In this embodiment, there are relatively more defect positions able to be mended at a single time on the light emitting surface 31, so the light emitting surface 31 is planned in chief After that, according to the positions of the rest of the miniature light emitting elements 39, the rest of the defect positions 333 and 353, i.e. the light emitting surfaces 33 and 35, are planned.

In the step 59, the transferring device is moved according to the mending sequence to make the miniature light emitting elements 39 on the transferring device in contact with the corresponding defect positions of the light emitting surfaces 31, 33 and 35, and make the miniature light emitting elements 39 welded at the defect positions 313, 333 and 353.

As shown in FIG. 3 to FIG. 6, FIG. 3 to FIG. 6 correspond to the mending for the defect positions 313, 333 and 353 of the four light emitting surfaces 31, 33, 35 and 37, and are the mending schematic views. When the work device 17 executes the choosing of the largest number of defect positions able to be mended at a single time in the mending procedure, the planning is performed according to the positions of the miniature light emitting elements 39 attached to the transferring surface, and the place with the largest number of defect positions 313, 333 and 353 in the area the transferring surface corresponds to in an orthographic projection manner.

For the defect position, at which there is no miniature light emitting element or the broken miniature light emitting element has been removed, it can be mended in the steps 57 and 59 in a way that the miniature light emitting element is electrically reconnected at the original position of the circuit. In other embodiments, the miniature light emitting element can be welded near the broken miniature light emitting element in the steps 57 and 59, that means the defect position allows the disposal of two miniature light emitting elements.

Figure 4:
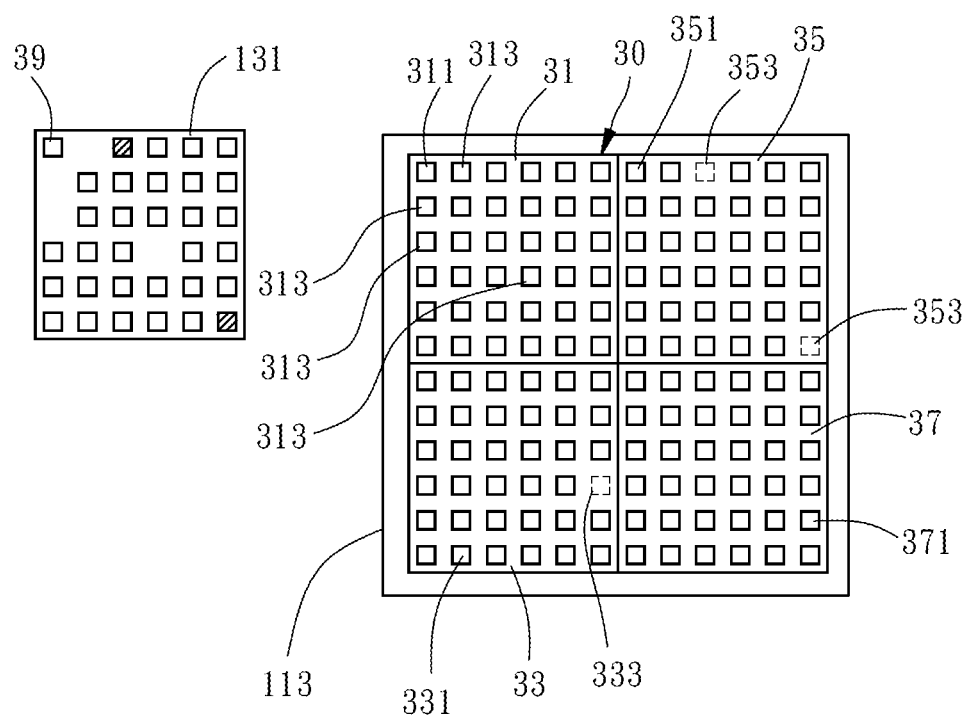

In FIG. 3, the four defect positions 313 on the light emitting surface 31 are just located in the orthographic projection area of the transferring surface 131, and four corresponding miniature light emitting elements 39 (rectangular boxes with diagonal lines) can be found on the transferring surface. Therefore, it gives precedence to plan the mending for the light emitting surface 31. Then, in FIG. 4, the miniature light emitting elements 39 which have been used in FIG. 3 are removed, the planning proceeds by the rest of the miniature light emitting elements 39, and the defect positions 313 finished being planned at the previous time are changed to be represented by solid rectangular boxes. For the two defect positions 353 of the light emitting surface 35, two corresponding miniature light emitting elements 39 (rectangular boxes with diagonal lines) can be still found on the transferring surface 131. At last, in FIG. 5, the miniature light emitting elements 39 which have been used in FIG. 4 are removed, the planning proceeds by the rest of the miniature light emitting elements 39, and the defect positions 353 finished being planned at the previous time are changed to be represented by solid rectangular boxes. For the defect position 333 of the light emitting surface 33, a corresponding miniature light emitting element 39 (rectangular box with diagonal lines) can be still found on the transferring surface 131. Thus, the mending procedure can be regarded as being completely planned.

Figure 5:
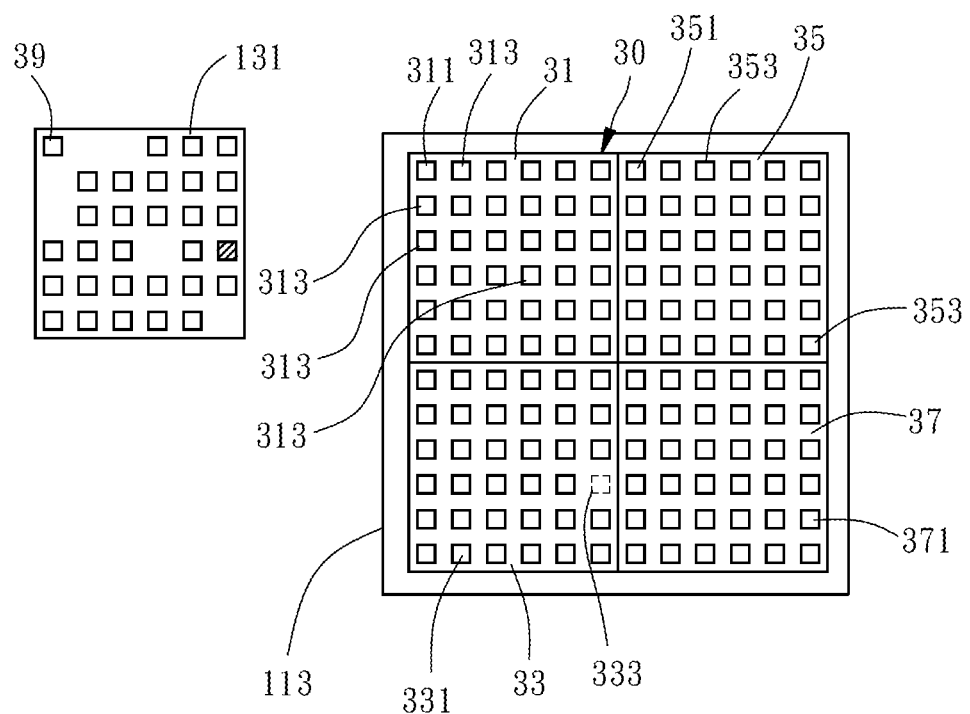
Figure 6:
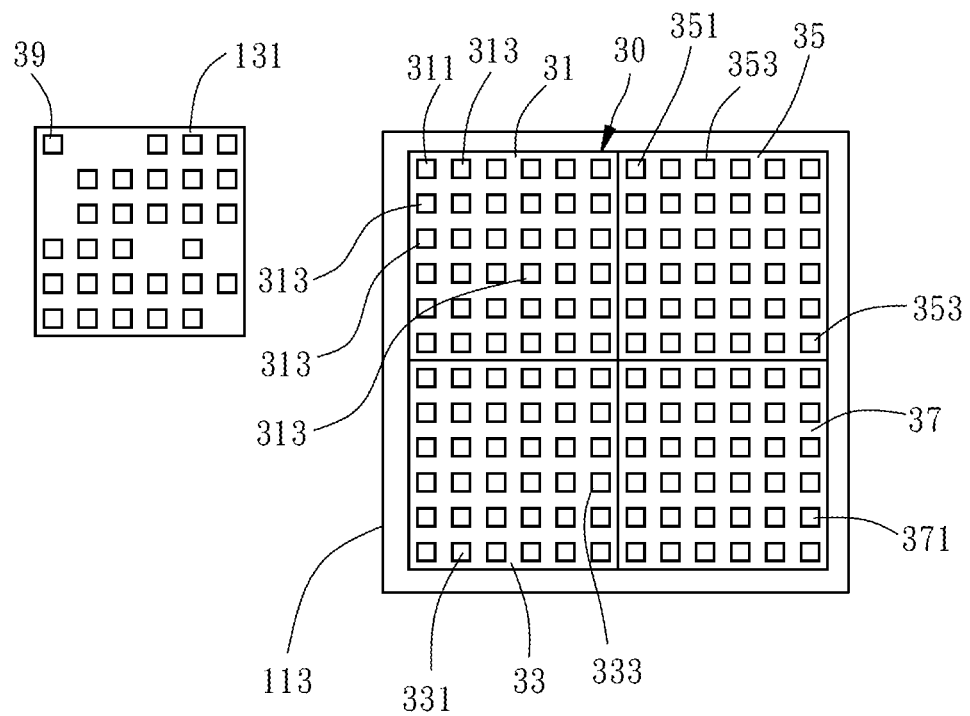

After that, in the step 59, the transferring device 13 is moved to the positions opposite to the corresponding light emitting surfaces 31, 33 and 35 in sequence according to the above-described plan to make the miniature light emitting elements 39 in contact with the corresponding defect positions 313, 333 and 353 of the light emitting surfaces 31, 33 and 35, and the welding is executed to make the miniature light emitting elements 39 welded at the defect positions 313, 333 and 353 of the light emitting surfaces 31, 33 and 35, as shown in FIG. 3 to FIG. 5, so that the mending of all defects is accomplished. In FIG. 6, all the defect positions 313, 333 and 353 of the display 30 have been mended, which means the miniature light emitting elements are rewelded there. The welding can be performed by laser, and unlimited in direction the laser is projected. As to the wave length of the laser, the wave length which will not be absorbed by the circuit substrate or the transferring device can be chosen, that can penetrate the circuit substrate or the transferring device to make contacts of the chosen and planned miniature light emitting elements 39 connected with conductive lines of the display 30.

In this embodiment, the mending method of the present invention makes the transferring device perform only three times of moving processes to mend seven defect positions, so that it can highly reduce the number of mending times and the period of time for mending, and can use the miniature light emitting elements 39 attached to the transferring device 13 effectively, so that the material waste is reduced. Besides, the rest of the miniature light emitting elements 39 on the transferring device 13 can be still planned through the above-described mending procedure. That means, at every time, according to the known positions or coordinates of the miniature light emitting elements 39 attached to the transferring surface 131, match and compare them with the defect positions in the area of the transferring surface corresponds to, so as to find out the corresponding or matched plurality of defect positions for performing one-time mending, thereby using up the miniature light emitting elements 39 on the transferring surface 131 successively.

In other embodiments, the positions of the miniature light emitting elements 39 may not totally correspond to all defects in the area of a single light emitting surface. Such situation is similar to that after the mending procedure is planned successively in the above-described embodiment, the positions of the miniature light emitting elements 39 attached to the transferring surface may be more and more scattered, making the planning much more difficult than that shown in FIG. 3. Therefore, in other embodiments, two times or more times of mending may have to be performed on the same light emitting surface. However, in principle, the largest number of defects mended at a single time is in chief.

Figure 7:
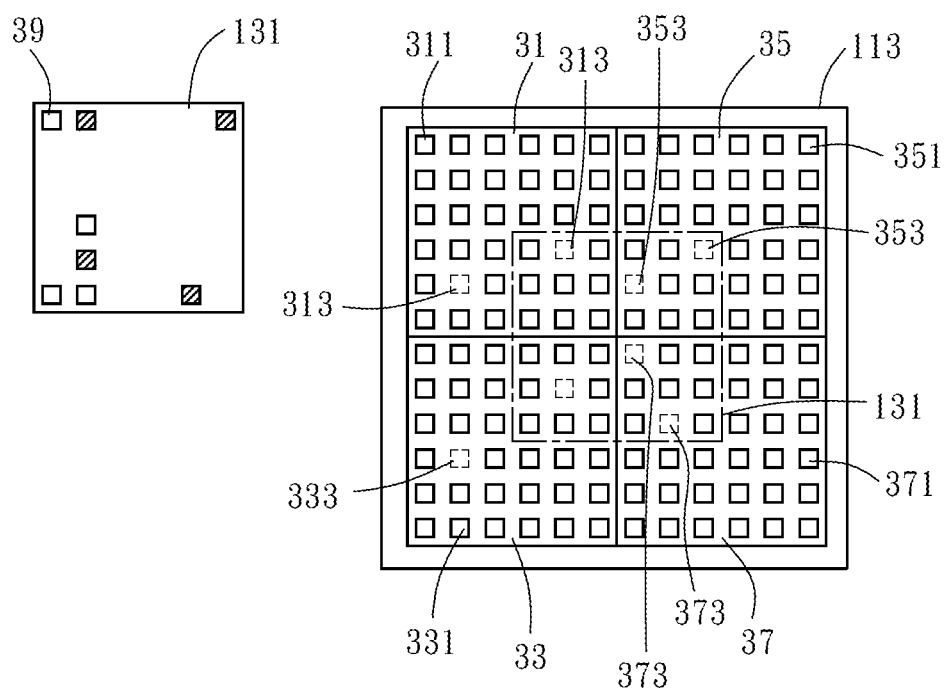
FIG. 7 to FIG. 9 are sequential schematic views of another embodiment of the mending procedure in FIG. 2.
Figure 8:
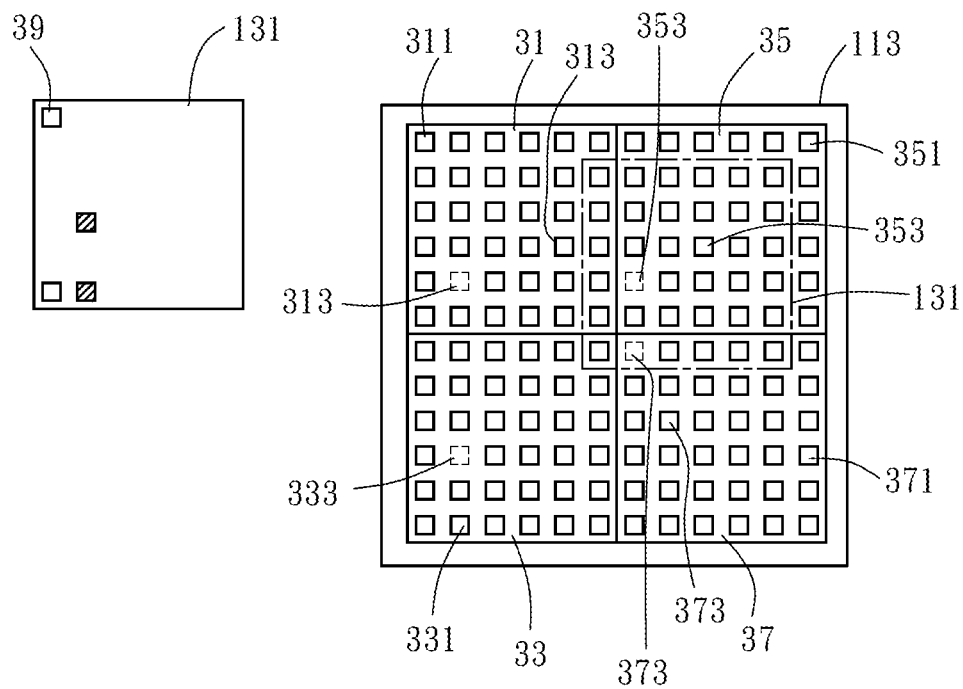
Figure 9:
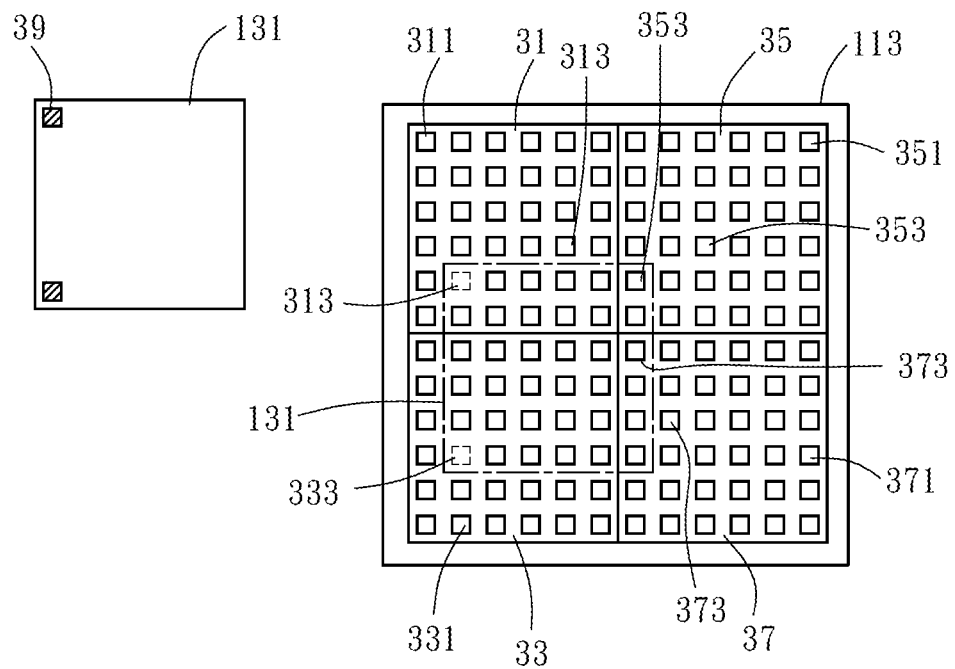

As shown in FIG. 7, this figure is a schematic view of an embodiment wherein the positions of the miniature light emitting elements 39 and the light emitting positions 311 don't correspond to each other totally. The miniature light emitting elements 39 attached to the transferring surface 131 of the transferring device 13 are not arranged as a complete 6×6 matrix, but the mending procedure can be still planned by the area of the transferring surface 131 corresponds to. In the figure, the area of the transferring surface corresponds to is represented by the single point chain line. In the embodiment, the area of the transferring surface 131 corresponds to includes four light emitting surfaces 31, 33, 35 and 37, and four miniature light emitting elements 39 (rectangular boxes with diagonal lines) are found at the positions corresponding to four of the defect positions 313, 333, 353 and 373. However, in this included area, two defect positions don't correspond to the positions of the miniature light emitting elements 39 of the transferring surface 131, and thereby has to be mended at the next time, as shown in FIG. 8. In FIG. 8, the defect positions finished being planned at the previous time are changed to be represented by solid rectangular boxes, and the miniature light emitting elements 39 which have been planned are removed. After the area of the transferring surface 131 corresponds to is displaced rightward and upward, the two defect positions not mended at the previous time can be included in the area, and two corresponding miniature light emitting elements 39 (rectangular boxes with diagonal lines) are found. At last, as shown in FIG. 9, the defect positions finished being planned at the previous time are changed to be represented by solid rectangular boxes in FIG. 9, and the miniature light emitting elements 39 which have been planned are removed. After the area of the transferring surface corresponds to is displaced leftward and downward, two defect positions of the light emitting surfaces 31 and 33 can be included in the area, and two corresponding miniature light emitting elements 39 (rectangular boxes with diagonal lines) are found. Thus, the mending procedure for the four light emitting surfaces 31, 33, 35 and 37 in the embodiment is accomplished, and the miniature light emitting elements 39 on the transferring device can be used effectively, so that the waste of the miniature light emitting elements 39 is reduced.

Thus, the mending method of the present invention can plan the mending according to the arranged positions of the miniature light emitting elements 39 attached to the transferring surface of the transferring device by comparing and matching them with at least one defect position, so as to plan and mend the defect positions in the area efficiently, and effectively use the attached miniature light emitting elements successively to reduce the material waste.

What is claimed is:

1. A mending method for a display, the mending method comprising: making a display device emit light, the display device comprising a plurality of light emitting surfaces arranged adjacent to each other, every said light emitting surface comprising a plurality of light emitting positions;
searching out a plurality of defect positions, the plurality of defect positions representing those not emitting light among the plurality of light emitting positions of the plurality of light emitting surfaces;
providing a transferring device comprising a transferring surface and a plurality of miniature light emitting elements attached to the transferring surface, positions of the plurality of miniature light emitting elements corresponding to the plurality of light emitting positions;
planning a mending procedure, the mending procedure comprising in an area the transferring surface corresponds to, identifying the largest number of said defect positions able to be mended at a single time according to the positions of the plurality of miniature light emitting elements, and then in the area the transferring surface corresponds to, planning the rest of the plurality of defect positions according to the rest of the plurality of miniature light emitting elements; and according to the mending procedure, moving the transferring device to make the plurality of miniature light emitting elements welded at the plurality of defect positions;

wherein the transferring surface and any one of the light emitting surfaces of the display device are equal in area.

2. The mending method as claimed in claim 1, wherein intervals between the adjacent light emitting positions in the plurality of light emitting positions are equal.

3. The mending method as claimed in claim 1, wherein the area the transferring surface corresponds to comprises at least two of the plurality of light emitting surfaces, which are located adjacent to each other.

4. The mending method as claimed in claim 1, wherein the chosen largest number of said defect positions able to be mended at a single time comprise at least two defect positions.

5. The mending method as claimed in claim 1, wherein the display device is a seamless tiled display.

6. The mending method as claimed in claim 1, wherein the plurality of light emitting surfaces are equal in area.

7. The mending method as claimed in claim 1, wherein the transferring device comprises a compressible layer; the transferring surface is located on the compressible layer.

* * * * *